United States Patent [19]
Marsh

[11] 3,963,491
[45] June 15, 1976

[54] IMAGING METHOD
[75] Inventor: Dana G. Marsh, Rochester, N.Y.
[73] Assignee: Xerox Corporation, Stamford, Conn.
[22] Filed: June 27, 1974
[21] Appl. No.: 483,730

[52] U.S. Cl. ............................... 96/27 R; 96/35.1; 96/115 R
[51] Int. Cl.² ...................... G03C 5/04; G03C 5/24
[58] Field of Search .......... 46/115 R; 96/36.3, 27 R, 96/35.1

[56] References Cited
UNITED STATES PATENTS

| | | | |
|---|---|---|---|
| 2,772,159 | 11/1956 | Elliott | 96/27 |
| 2,892,712 | 6/1959 | Plambeck | 96/36.3 |
| 3,558,311 | 1/1971 | Delzenwe | 96/36.3 |
| 3,734,730 | 5/1973 | Jones et al. | 96/36.3 |

Primary Examiner—David Klein
Assistant Examiner—John L. Goodrow
Attorney, Agent, or Firm—James J. Ralabate; James P. O'Sullivan; Jerome L. Jeffers

[57] ABSTRACT

Disclosed is an imaging method which involves exposing to activating radiation in an imagewise manner a film comprised of a matrix polymer as the principal ingredient, a degradable polymer and a photo-oxidant. Exposure of the film causes degradation of the degradable polymer, e.g., poly(acetaldehyde), whereupon the film undergoes a change in optical density in the exposed areas to provide a visible image.

17 Claims, No Drawings

IMAGING METHOD

BACKGROUND OF THE INVENTION

Light sensitive copying compositions containing a light insensitive polymer and a light sensitive heterocyclic composition are known. For example, U.S. Pat. No. 3,776,735 discloses a light sensitive copying composition comprising a high molecular weight light-insensitive polymer containing units having carboxylic groups, phosphonic acid groups, sulfonic acid groups or N-arylsulfonyl urethane groups together with certain light sensitive nitrogen compounds containing at least one six-membered N-heterocyclic nucleus and at least one benzene nucleus. Forming the composition into a film, exposing the film to light in an imagewise manner with subsequent development of the exposed film provides a visible image.

Preparation of relief images by the photoinduced degradation of poly(formaldehyde) is disclosed in U.S. Pat. No. 2,892,712 (Example VII). In this method, a thin film of formaldehyde polymer coated with a thin layer of omega, omega-dibromoacetophenone is irradiated with ultraviolet light and baked at 105°C. to provide a sheet having a letter text incised into the surface of the film.

It is an object of the present invention to provide a novel imaging method based upon the photodegradation of certain degradable polymers.

It is a further object to provide such a method in which sharp, distinct images having high resolution are obtained.

An additional object is to provide such a method in which no separate development step is required after exposure.

SUMMARY OF THE INVENTION

The present invention is an imaging method which involves exposing to activating radiation in an imagewise manner a film comprising:

a. a matrix polymer as the principal ingredient;
b. a degradable polymeric composition containing segments characterized by the formula:

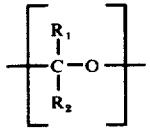

wherein $R_1$ is hydrogen or methyl and $R_2$ is hydrogen, an alkyl radical of 1 to 6 carbon atoms, a chlorinated or fluorinated aliphatic radical of 1 to 6 carbon atoms or a cyano substituted radical of 1 to 5 carbon atoms provided that when $R_1$ is methyl, $R_2$ is also methyl; and c. a photo-oxidant which upon activation is capable of abstracting one or more electrons from one or more oxygen atoms of said degradable polymeric composition.

DETAILED DESCRIPTION

When the matrix polymer, degradable polymer and photo-oxidant are formed into a thin layer, a flexible self-supporting film results. Exposing the film to activating radiation in an imagewise manner causes degradation of the degradable polymer whereby the exposed areas undergo a change in optical density thereby forming a visible image in the film. In some cases, the light struck areas will appear transparent whereas the background areas will appear translucent or opaque, thereby providing a negative working system. In other cases, the optical density of the imaged areas increases thereby providing a positive working system in which the exposed areas appear translucent or opaque on a clear or translucent background. The nature of the system, i.e., whether it be positive or negative working, will depend on the nature of the matrix polymer, the photo-oxidant used and to some extent on the molecular weight of the degradable polymer.

In practicing the present invention, the matrix polymer, degradable polymer and photo-oxidant are dissolved in a suitable solvent and applied to a substrate in the form of a thin layer. Evaporation of the solvent leaves a film which, when exposed to activating radiation, bears a visible image corresponding to the exposed areas. Since the film is self-supporting, it can be stripped from the substrate and used as a projection master. This embodiment is especially useful when the film is of the type which forms a negative image. Certain of the films within the scope of the invention can be imaged to a very high resolution and are therefore useful as microfilm. The films can be applied to a dark background and left on the substrate after imaging. Use of a black substrate will provide a negative appearing final image when films are used in which the light struck areas appear transparent and a positive appearing image when the optical density of the exposed areas is increased over that of the background.

Suitable matrix polymers are those materials which can be combined with the degradable polymer and photo-oxidant to form a unifrom film. The term matrix polymer is used herein to designate a polymer within which something else originates or develops. The matrix polymer makes up the major part of the film within which the other components are dispersed. Generally, the matrix polymer is an inert constituent of the film but may, in certain formulations, play an active role in the image forming process. Exemplary of polymers useful as the matrix polymer are poly(vinylchloride), poly(vinylformal), poly(vinylbutyral), poly(vinylalcohol), poly(methylmethacrylate), poly(vinylpyrrolidone) and poly(vinylidene chloride). Copolymers and block copolymers may also be employed as the matrix material.

Suitable degradable polymers for use in the process of the instant invention can be prepared by the polymerization of aldehydes to give polymers which correspond to the formula previously set out. When aldehydes which contain alkyl groups of 1 to 6 carbon atoms attached to the carbonyl carbon atom are polymerized, polymers result in which the $R_2$ moiety corresponds to the alkyl group of the aldehyde. Examples of aldehydes which contain such moieties include acetaldehyde, propionaldehyde, n-butyraldehyde, isobutyraldehyde, valeraldehyde and heptaldehyde. The $R_2$ moiety may also be hydrogen as is the case with poly(formaldehyde).

Alternatively, the aldehyde may contain a chlorinated or fluorinated hydrocarbon radical of from 1 to 6 carbon atoms to provide a polyaldehyde in which the R moiety corresponds to the group attached to the carbonyl carbon of the aldehyde. Examples of such aldehydes include chloroacetaldehyde, dichloroacetaldehyde, chloropropionaldehyde, chlorobutyraldehyde, chlorovaleraldehyde, chloroheptaldehyde, trifluoroacetaldehyde, trifluoropropionaldehyde, chlorodifluoroacetaldhyde and fluoroheptaldehyde.

In addition, aldehydes which contain cyano substituted aliphatic hydrocarbon radicals containing from 1 to 5 carbon atoms attached to the carbonyl carbon can be polymerized to form degradable polymers useful in the process of the instant invention. Examples of these aldehydes include cyanoacetaldehyde, beta-cyanopropionaldehyde and 5-cyanopentaldehyde.

While ketones are not normally thought of as being polymerizable, poly(acetone) has been reported in the literature by V. A. Kargin, et al. in Dokl. Akad. Navk. SSSR, 134, 1098 (1960), and can be degraded by the action of photo-oxidants in a manner similar to polyaldehydes. Thus, the polymers corresponding to the foregoing formula in which both $R_1$ and $R_2$ are methyl may be used.

When homopolymers of the above-described carbonyl compounds are used, the degradable polymer can be represented by the formula:

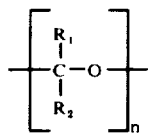

wherein $R_1$ and $R_2$ are as defined above and $n$ is a number representing the degree of polymerization. The degree of polymerization of the homopolymer may be quite low as in the case of oligomers or as high as the realities of the polymerization of the carbonyl compound permit. In general, those polymerized carbonyl compounds characterized by the foregoing formula in which $n$ is a number in the range of from 20 to 20,000 are preferred for use in the instant invention.

In addition to homopolymers of the aforementioned carbonyl compounds, copolymers and block copolymers containing degradable segments characterized by the foregoing formula can be employed. For example, copolymers and block copolymers may be prepared from one or more of the carbonyl compounds and other polymerizable constituents such as styrene, isoprene, α-methylstyrene, methylmethacrylate, phenyl isocyanate and ethyl isocyanate. In addition, the degradable segments may occur as side chains appended from the backbone of another polymer.

Useful photo-oxidants are those compositions which, when activated by exposure to electromagnetic radiation in the proper wavelengths (activating radiation) are capable of abstracting one or more electrons from one or more oxygen atoms in the backbone of the degradable polymer or result in oxidizing the polymer via hydrogen transfer. Suitable photo-oxidants include aromatic carbonyl compounds, e.g., 2-acetonaphthone, fluorenone, xanthone, perfluorobenzophenone, N-methyl acridone, benzophenone, and benzophenone derivatives such as Michler's ketone, naphthophenone and benzil; pyrylium salts, e.g. 2,4,6-triphenyl pyrylium tetralfuoroborate and 2,4,6-tritolylpyrylium tetrafluoroborate; anthracene and derivatives, e.g., 9,10-dycyanoanthracene; diazonium salts, e.g., diethylaminobenzene diazonium tetrafluoroborate; diethylaminobenzene diazonium zinc chloride; para quinoid compounds, e.g., anthraquinones, 2-t-butylanthraquinone, phenanthraquinones, dicyanodichloro-p-benzoquinone and p-benzoquinone; unsaturated anhydrides, e.g., maleic anhydride, chloromaleic anhydride and pyromelletic dianhydride; bipyridylium salts, e.g., 1,1'-dimethyl-4,4'-bipyridylium dichloride; tosylate salts, e.g., tetraethylammonium-p-toluene sulfonate and diaza heterocyclic compounds, e.g., pyridazine; 9,10 -diazaphenanthrene; 1,2-diazanaphthalene; 5,10 -diazaanthracene; 1,2:3,4:6,7-tribenzophenazine; 1,4 diazanaphthalene; and 5,6:7,8-dibenzoquinoxaline.

In addition certain dyes and colorants listed in the Color Index, vol. 4 and 5 of The Society of Dyers and Colorists American Association of Chemists and Colorists may be used as the photo-oxidant. Exemplary of these materials are hydroxy phthaleins, e.g., Rose Bengal, Phloxine, Phloxine B, Erythrosin B, Erythosin, Fluorescein, Eosine and Dibromoeosine; Acridines e.g., Acriflavin and Acridine Orange R; Thiazines, e.g., Methylene Blue; Rhodamines, e.g., Rhodamine B and Rhodamine 6G; Monoazo dyes, e.g., Methyl Orange and Triarylmethane dyes (diamino and triamino derivatives), e.g., Brilliant Green and Methyl Violet.

In additon, natural organic sensitizers such as chlorophyl, riboflavin and hematoporphrins may be used as the photo-oxidant in the present invention.

While the invention is not predicated upon any particular theory of operation, it is known that the photo-oxidant attacks the degradable polyether compound and causes it to break down into segments of greatly reduced molecular weight which tends to alter the relationship between the matrix polymer and degradable (degraded) polymer resulting in a change in optical density in the exposed areas to provide a visible image corresponding to the exposed areas. The exact nature of the change which accounts for the difference in optical density between the exposed and non-exposed areas varies from system to system depending on the matrix polymer and photo-oxidant employed as well as the molecular weight of the degradable polymer. Thus, in certain systems the imaged areas appear transparent in an opaque background while other systems provide opaque images in a clear (as opposed to opaque) background. In other systems, either the image or background areas appear translucent. Examination of imaged films prepared in accordance with the present invention by transmission electron microscope (TEM) techniques reveals large scale differences between the different types of images. Translucent areas are observed to contain void spaces suggesting vesicular scattering. The clear areas are seen as one continuous phase under TEM examination while the opaque areas are seen as two separate phases.

The following mechanism is believed to account for the degradation of poly(acetaldehyde) by the photo-oxidant upon exposure to activating radiation. 1. Irradi- 1. Irradiation with activating radiation leads to an excited state of the photo-oxidant.

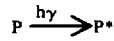

2. An oxonium ion is formed via electron transfer.

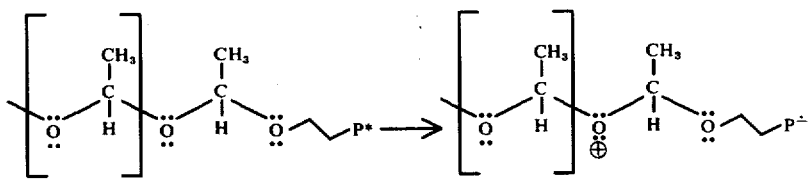

3. Electron shift and chain cleavage converts the oxonium ion into a carbonium ion and an oxy radical.

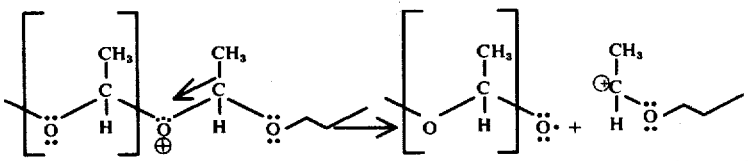

4. The carbonium ion undergoes degradation.

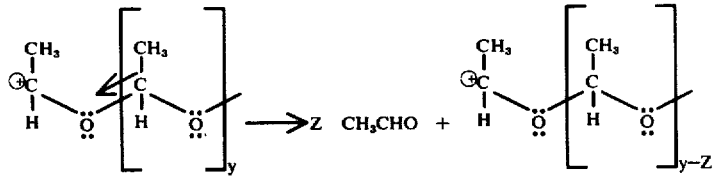

The oxy radical formed may have several fates. A radical abstraction reaction may occur leading to a hemiacetal end-capped polymer fragment and a radical fragment. The end-capped fragment is relatively stable and no further depolymerization will occur. The radical fragment may be involved in an electron transfer to ground state photo-oxidant leading to further depolymerization.

In practicing the process of the invention, the matrix polymer, degradable polymer and photo-oxidant are dissolved in a suitable solvent and applied to a substrate in a thin layer. Evaporation of the solvent leaves a film which, when exposed to activating radiation, bears a visible image corresponding to the exposed areas. Suitable solvents are those compositions which dissolve both of the polymers and the photo-oxidant and do not detrimentally interact with them. The solvent should be sufficiently volatile so as to be readily evaporated from the solutes. Useful solvents include tetrahydrofuran (THF), carbon disulfide, acetone and methyl ethyl ketone. In certain cases it may be necessary to aid a small amount of a material which is more polar than the primary solvent to the system in order to dissolve the photo-oxidant.

The relative proportions of matrix polymer, degradable polymer and photo-oxidant are not critical provided that the matrix polymer is the principal ingredient. In general, the degradable polymer will make up from 0.1 to 49 and preferably 5 to 10 weight percent and the photo-oxidant from 0.01 to 10 and preferably 0.5 to 1 weight percent of the film.

Exemplary of substrates upon which the film may be cast are Mylar, glass, metals and coated papers. The thickness of the film is not critical but is generally greater than about 1 micron because of fabrication problems with submicron films. Thicknesses up to about 5 microns or more are satisfactory. The process of coating the film on the substrate may include roller coating, knife coating, mil coating, brushing, etc. A preferred method is to use a doctor blade as applicator.

Upon casting the film and evaporating the solvent, optionally with gentle heating to ensure solvent removal, the composition is ready for imaging which is accomplished by subjecting it to activating radiation in an imagewise fashion, i.e., irradiating the film in those areas in which the image is desired. This is normally done by placing a stencil or negative having areas which are opaque and transparent to the radiation between the light source and the film and directing the light source through this barrier to the film.

Activating radiation, as used herein, is intended to refer to electromagnetic radiation having wavelengths within the range which will excite the photo-oxidant. Light in the ultraviolet, near ultraviolet or visible portions of the spectrum is normally used. Selection of the most desirable range of wavelengths will depend on the photo-oxidant being used.

The invention is further illustrated by the following examples in which all percentages are by weight of the solution from which the film is cast.

EXAMPLE I

Films for imaging are prepared by dissolving 1% poly(acetaldehyde) having a molecular weight of approximately 85,000, 10% poly(vinylformal) and 1% 2-t-butylanthraquinone in tetrahydrofuran. The solution is spread on Mylar sheets with a doctor blade using a 4 mil gate to provide films having a thickness of about 5 μ upon evaporation of the solvent.

The films are exposed through a negative using a PEK-112 mercury arc lamp emitting in the ultraviolet region for varying periods of time. The exposure times and results observed for a given exposure time are set out below.

60 sec.—faint, low density opaque image on a clear background after several hours 120 sec.—good opaque image on a clear background after several hours 180 sec.—excellent opaque image on a clear background after several hours 300 sec.—excellent opaque image on a clear background immediately It is observed that the background in the film exposed for 300 seconds is not as clear as that in the film exposed for 180 seconds suggesting that an exposure time of 180 seconds may be optimum for this system.

EXAMPLE II

Films for imaging are prepared by dissolving 10% poly(vinylchloride), 1% poly(acetaldehyde) having a molecular weight of approximately 250,000 and 0.1% 2-t-butylanthraquinone in tetrahydrofuran. The solution is spread on Mylar film and imaged as in Example I.

The results observed with varying exposure times are set out below.

30 sec.—good clear image on opaque background
60 sec.—good clear image on opaque background (optimum)
120 sec.—good clear image on opaque background
180 sec.—good clear image on opaque background
300 sec.—overexposed

EXAMPLE III

A film containing 10% poly(vinylformal), 1% poly(acetaldehyde) having a molecular weight of approximately 85,000 and 0.1% 2-t-butylanthraquinone is prepared as previously described. Exposure through a negative for 300 seconds provides an opaque image on a clear background which is distinct and exhibits high resolution.

EXAMPLE IV

Films containing 10% poly(vinylchloride), 1% poly(acetaldehyde) having a molecular weight of approximately 85,000 and 1% 2-t-butylanthraquinone are prepared and imaged as previously described. Exposure for periods of 30, 60, 120, 180 and 300 seconds immediately produces a clear image on an opaque background. However, the background becomes clear after several days thereby obscuring the image presumably because the concentration of photo-oxidant is too high.

EXAMPLE V

Films are prepared for imaging by dissolving 10% poly(vinylchloride), 1% poly(acetaldehyde) having a molecular weight of approximately 85,000 and 0.1% 2,4,6-tritolylpyrylium tetrafluoroborate in methylene chloride containing 0.5 milliliter acetonitrile. The solution is applied to Mylar film as previously described and exposed through a negative with a PEK-112 lamp for periods of 30, 60, 120, 180 and 300 seconds. Clear, pink images on an opaque, chartreuse background are obtained.

EXAMPLE VI

A film containing 10% poly(vinylformal), 1% poly(acetaldehyde having a molecular weight of about 85,000 and 0.1% 2,4,6-tritolylpyrylium tetrafluoroborate is prepared as previously described and exposed through a negative for 300 seconds. After exposure, a clear, pink image in an opaque, chartreuse background is observed.

EXAMPLE VII

Films containing 10% poly(vinylformal), 1% poly(acetaldehyde) having a molecular weight of about 85,000 and 1% 2,4,6-tritolylpyrylium tetrafluoroborate are prepared and exposed as before. Exposure for varying periods of time provides the following results:

60 sec.—opaque image in clear, yellow background
120 sec.—opaque image in clear, yellow background
180 sec.—opaque image in slightly opaque yellow background
300 sec.—clear image in opaque yellow background

EXAMPLE VIII

Films containing 10% poly(vinylchloride), 1% poly(acetaldehyde) having a molecular weight of approximately 85,000 and 1% 2,4,6-tritolylpyrylium tetrafluoroborate are prepared and exposed as previously described. Exposure for varying periods of time produces the following results.

30 sec.—excellent clear image in uniform opaque, yellow background
60 sec.—superior clear image in opaque, yellow background
120, 180 and 300 seconds—good images but overexposure is observed which increases with increased exposure time In the experiments using 2,4,6-tritolylpyrylium tetrafluoroborate as photo-oxidant, the images were initially poor but developed out upon standing for several hours.

EXAMPLE IX

Films containing 10% poly(vinylchloride), 1% poly(acetaldehyde) having a molecular weight of about 250,000 and 0.1% diethylaminobenzene diazonium tetrafluoroborate were made from a solution of methylene chloride containing acetonitrile as previously described. Exposing the films through a negative to the radiation emitted by a PEK-112 lamp for periods of 240, 300 and 600 seconds produces an indistinct, somewhat translucent image in a grainy, opaque background.

Exposing the film to 10 flashes from a Xenon flash lamp produces a clear image in a translucent background.

EXAMPLE X

A film containing 10% poly (vinylformal), 1% poly (acetaldehyde) having a molecular weight of about 85,000 and 0.1% diethylaminobenzene diazonium tetrafluoroborate is prepared as before and exposed to the radiaton emitted from a PEK-112 lamp for 300 seconds. The irradiation produces an opaque image on a translucent background. The image has a low denisty but is found to be clear and distinct.

EXAMPLE XI

Films containing 10% poly (vinylchloride), 1% poly(acetaldehyde) having a molcular weight of about 85,000 and 1% diethylaminobenzene diazonium tetrafluoroborate are prepared as before. A 30 second exposure with the PEK-112 lamp provides a superior clear image in a uniform white, opaque background. A 60 second exposure time renders an image which is overexposed whereas 120, 180 and 300 second exposure times render images which are grossly overexposed due to destruction of the opaque background.

EXAMPLE XII

A film containing 10 parts poly(vinylformal), 1 part poly(acetaldehyde) and 1 part diethylaminobenzene diazonium zinc chloride is applied to a Mylar substrate from its solution in methylene chloride containing acetonitrile. Exposure through a negative from the radiation emitted from the PEK-112 lamp yields a clear image in an opaque, brown background in areas exposed to high light intensity and a translucent image in an opaque brown background in areas exposed to low light intensity.

EXAMPLE XIII

Films containing 10 parts poly(vinylchloride), 1 part poly(acetaldehyde) having a molecular weight of 250,000 and 0.1 part diethylaminobenzene diazonium zinc chloride are prepared as before.

Exposure of the film to 10 flashes of a Xenon flash lamp produces an opaque image, which clears upon standing, in an opaque background. Exposure of the film with the PEK-112 lamp for 60 and 120 seconds produces no image. Exposure for 180 and 300 seconds provides an indistinct clear image in an opaque background. The background opacity increases with time to the point of obscuring the image.

EXAMPLE XIV

Films are prepared containing 10 parts poly(vinylformal), 1 part poly(acetaldehyde) having a molecular weight of 85,000 and 1 part diethylaminobenzene diazonium zinc chloride and imaged as before for various periods of time. The results of these experiments are as follows:
- 30 sec. — faint clear image in an opaque background
- 60 sec. — good clear image in an opaque background
- 120 sec. — excllent clear image in an opaque background
- 180 sec. — excellent clear image in an opaque background (no improvement over 120 sec.)
- 300 sec. — overexposed image

EXAMPLE XV

Films are prepared containing 10 parts poly(vinylchloride), 1 part poly(acetaldehyde). having a molecular weight of approximately 85,000 and 1 part diethylaminobenzene diazonium zinc chloride. Exposure of the films to the radiation emitted by the PEK-112 lamp for varying periods of time yields the following results:
- 30 sec. — clear image on a yellow-brown translucent background
- 60, 120, 180 and 300 sec. — overexposed images as indicated by loss of resolution in the imaged areas

EXAMPLE XVI

Films containing 10 parts poly(vinylformal), 1 part poly(acetaldehyde) having a molecular weight of 85,000 and 0.1 part 2,4,6-trimethylpyrylium tetrafluoroborate are prepared from their solution in methylene chloride containing 0.5 milliliter acetonitrile. Exposure of the film for 180 seconds produces no image. Exposure for 300 seconds produces a clear distinct image in a uniform, dense, opaque background. The image fades out upon standing. Exposure of the film for 800 seconds provides a superior, clear image having high resolution on an opaque background.

EXAMPLE XVII

Films similar to that described in Example XVI are prepared except that 1 part of the photooxidant is employed. Exposure of the films to the radiation emitted from the PEK-112 lamp for varying periods of time provides the following results:
- 30, 60 and 120 sec. — poor low contrast images. Images disappear upon standing as films become uniformly opaque
- 180 sec. — good image which disappears upon standing
- 300 sec. — good image

EXAMPLE XVIII

Films are prepared containing 10 parts poly(vinylchloride), 1 part poly(acetaldehyde) having a molecular weight of about 85,000 and 1 part maleic anhydride by casting from methylene chloride solution onto Mylar sheets. Exposing the films to the radiation emitted from the PEK-112 lamp for periods up to 300 seconds provides only faint clear images in a clear background.

Films are prepared as above except that 0.1 part maleic anhydride is used. Exposure of the film to 10 flashes from a Xenon flash lamp produces a translucent image in an opaque background. Exposing the film with the PEK-112 lamp for 600 seconds provides a clear image in an opaque background.

EXAMPLE XIX

Films are prepared containing 10 parts poly(vinylchloride), 1 part poly(acetaldehyde) having a molecular weight of about 85,000 and 1 part tetraethylammonium-p-toluene sulfonate by casting the solids from methylene chloride solutions. Exposure of the film through a negative to the radiation emitted from the PEK-112 lamp for 180 seconds produces a faint clear image on a slightly translucent background. The image contrast is improved by increasing the exposure time to 300 seconds.

EXAMPLE XX

Films are prepared containing 10 parts poly(vinylchloride), 1 part poly(acetaldehyde) having a molecular weight of about 250,000 and 0.1 part tetraethylammonium-p-toluene sulfonate. Exposing the film to 10 flashes from a Xenon flash lamp through a stencil produces a clear image in an opaque background. Exposure of the film through a negative to the radiation emitted by the PEK-112 lamp produces no image with exposure times up to 600 seconds.

What is claimed is:

1. An imaging method which comprises exposing to activating radiation in an imagewise manner a film comprising:
   a. a matrix polymer as the principal ingredient;
   b. a degradable polymeric composition containing segments characterized by the formula:

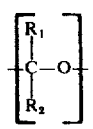

wherein $R_1$ is hydrogen or methyl and $R_2$ is hydrogen, an alkyl radical of 1 to 6 carbon atoms, a chlorinated or fluorinated aliphatic radical of 1 to 6 carbon atoms or a cyano substituted radical of 1 to 5 carbon atoms provided that when $R_1$ is methyl, $R_2$ is also methyl; and c. a photo-oxidant which upon activation is capable of abstracting one or more electrons from one or more oxygen atoms of said degradable polymeric composition, thereby causing the degradable polymer to break down into segments of greatly reduced molecular weight and thereby altering the relationship between the matrix polymer and degradable polymer to cause a change in the optical density in the exposed areas and provide a visible image corresponding to the exposed areas.

2. The method of claim 1 wherein the matrix polymer is poly(vinylchloride), poly(vinylformal), poly(methylmethacrylate), poly(vinylpyrrolidone), poly(vinylalcohol) or poly(vinylidene chloride).

3. The method of claim 1 wherein the degradable polymer is poly(acetaldehyde).

4. The method of claim 1 wherein the degradable polymer is a homopolymer represented by the formula:

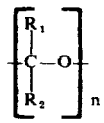

wherein $R_1$ and $R_2$ are as previously defined and $n$ is a number in the range of from 20 to 20,000 representing the degree of polymerization.

5. The method of claim 4 wherein $R_1$ is hydrogen and $R_2$ is methyl.

6. The method of claim 1 wherein the film contains from 0.1 to 49 weight percent of the degradable polymer, from 0.01 to 10 weight percent of the photo-oxidant with the remainder being the matrix polymer.

7. The method of claim 6 wherein the film contains from 5 to 10 weight percent of the degradable polymer and from 0.5 to 1 weight percent of the photo-oxidant.

8. The method of claim 1 wherein the activating radiation is light in the ultraviolet, near ultraviolet or visible regions of the spectrum.

9. The method of claim 1 wherein the photo-oxidant is an aromatic carbonyl compound, a pyrylium salt, anthracene or a derivative thereof, a diazonium salt, a para quinoid compound, an unsaturated anhydride, a tosylate salt, a diaza heterocyclic compound or a mixture thereof.

10. A composition of matter in the form of a thin film which can be imaged by exposure to activating radiation comprising:

a. a matrix polymer as the principal ingredient;

b. a degradable polymeric composition containing segments characterized by the formula:

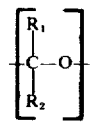

wherein $R_1$ is hydrogen or methyl and $R_2$ is hydrogen, an alkyl radical of 1 to 6 carbon atoms, a chlorinated or fluorinated aliphatic radical of 1 to 6 carbon atoms or a cyano substituted radical of 1 to 5 carbon atoms provided that when $R_1$ is methyl, $R_2$ is also methyl; and c. a photo-oxidant which upon activation if capable of abstracting one or more electrons from one or more oxygen atoms of said degradable polymeric composition.

11. The composition of claim 10 wherein the matrix polymer is poly(vinylchloride), poly(vinylformal), poly(methylmethacrylate), poly(vinylpyrrolidone), poly(vinylalcohol) or poly(vinylidene chloride).

12. The composition of claim 10 wherein the degradable polymer is poly(acetaldehyde).

13. The composition of claim 10 wherein the degradable polymer is a homopolymer represented by the formula:

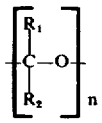

wherein $R_1$ and $R_2$ are as previously defined and $n$ is a number in the range of from 20 to 20,000 representing the degree of polymerization.

14. The composition of claim 13 wherein $R_1$ is hydrogen and $R_2$ is methyl.

15. The composition of claim 10 wherein the film contains from 0.1 to 49 weight percent of the degradable polymer, from 0.01 to 10 weight percent of the photo-oxidant with the remainder being the matrix polymer.

16. The composition of claim 15 wherein the film contains from 5 to 10 weight percent of the degradable polymer and from 0.5 to 1 weight percent of the photo-oxidant.

17. The composition of claim 1 wherein the photo-oxidant is an aromatic carbonyl compound, a pyrylium salt, anthracene or a derivative thereof, a diazonium salt, a para quinoid compound, an unsaturated anhydride, a tosylate salt, a diaza heterocyclic compound or a mixture thereof.

* * * * *

UNITED STATES PATENT AND TRADEMARK OFFICE
CERTIFICATE OF CORRECTION

PATENT NO. : 3,963,491
DATED : June 15, 1976
INVENTOR(S) : Dana G. Marsh

It is certified that error appears in the above-identified patent and that said Letters Patent are hereby corrected as shown below:

Column 1, line 6, insert "as the principal ingredient" between the words "polymer" and "and".

Column 2, line 36, "unifrom" should be corrected to read --uniform--.

Column 4, line 58, delete "1. Irradi-".

Column 7, line 65, "(acetaldehyde having" should be corrected to read --(acetaldehyde) having--.

Column 8, line 57, "denisty" should be corrected to read --density--.

Column 9, line 39, "excllent" should be corrected to read --excellent--.

Column 12, line 15, delete "if" and insert --is--.

Signed and Sealed this

Twenty-first Day of September 1976

[SEAL]

Attest:

RUTH C. MASON
*Attesting Officer*

C. MARSHALL DANN
*Commissioner of Patents and Trademarks*